United States Patent
Kwon et al.

(10) Patent No.: US 8,822,809 B2
(45) Date of Patent: Sep. 2, 2014

(54) SOLAR CELL APPARATUS AND METHOD FOR MANUFACTURING THE SAME

(75) Inventors: Se Han Kwon, Seoul (KR); Jung Shik Baik, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 50 days.

(21) Appl. No.: 13/381,795

(22) PCT Filed: Oct. 15, 2010

(86) PCT No.: PCT/KR2010/007086
§ 371 (c)(1),
(2), (4) Date: Dec. 30, 2011

(87) PCT Pub. No.: WO2011/046388
PCT Pub. Date: Apr. 21, 2011

(65) Prior Publication Data
US 2012/0103416 A1     May 3, 2012

(30) Foreign Application Priority Data

Oct. 15, 2009 (KR) .................. 10-2009-0098333
Nov. 6, 2009 (KR) .................. 10-2009-0106763

(51) Int. Cl.
| | |
|---|---|
| *H02N 6/00* | (2006.01) |
| *H01L 31/042* | (2014.01) |
| *H01L 31/00* | (2006.01) |
| *H01L 27/142* | (2014.01) |

(52) U.S. Cl.
CPC ................................ *H01L 27/1426* (2013.01)
USPC ........................................... 136/244; 136/256

(58) Field of Classification Search
CPC ............ H01L 27/1422; H01L 27/1423; H01L 27/1426; H01L 27/1425

USPC .................................................. 136/256, 244
See application file for complete search history.

(56) References Cited

U.S. PATENT DOCUMENTS

| | | | | |
|---|---|---|---|---|
| 4,443,651 | A | * | 4/1984 | Swartz .......................... 136/249 |
| 4,873,201 | A | * | 10/1989 | Grimmer et al. ................ 438/80 |
| 5,470,790 | A | | 11/1995 | Myers et al. |
| 6,521,823 | B2 | * | 2/2003 | Kubota et al. ................. 136/246 |

(Continued)

FOREIGN PATENT DOCUMENTS

| | | |
|---|---|---|
| EP | 1843399 A2 | 10/2007 |
| EP | 2068369 A1 | 6/2009 |

(Continued)

OTHER PUBLICATIONS

Yun, J.H. "Compound Thin-Film Solar Cell" *Physics & High Technology*, Aug. 2008, pp. 20-24.

(Continued)

*Primary Examiner* — Eli Mekhlin
(74) *Attorney, Agent, or Firm* — Saliwanchik, Lloyd & Eisenschenk

(57) ABSTRACT

Disclosed are a solar cell apparatus and a method for manufacturing the same. The solar cell apparatus includes a substrate; a back electrode layer on the substrate; a light absorbing layer on the back electrode layer; a front electrode layer on the light absorbing layer; and a connection wire extending from the front electrode layer and connected to the back electrode layer through the light absorbing layer, wherein the connection wire directly makes contact with an inner side of a recess formed in the back electrode layer.

12 Claims, 10 Drawing Sheets

(56) References Cited

U.S. PATENT DOCUMENTS

| | | |
|---|---|---|
| 2005/0172998 A1 | 8/2005 | Gee |
| 2005/0253142 A1* | 11/2005 | Negami et al. .................. 257/65 |
| 2007/0235075 A1 | 10/2007 | Park |
| 2009/0065800 A1 | 3/2009 | Wirth et al. |
| 2009/0183763 A1* | 7/2009 | Meyer ........................... 136/246 |
| 2009/0194150 A1* | 8/2009 | Aoki ............................. 136/252 |
| 2011/0079272 A1* | 4/2011 | Tokioka et al. ............... 136/249 |
| 2012/0138126 A1 | 6/2012 | Yata |

FOREIGN PATENT DOCUMENTS

| | | |
|---|---|---|
| JP | S59-96779 | 6/1984 |
| JP | 2002-319686 A | 10/2002 |
| JP | 2005-101383 A | 4/2005 |
| JP | 2007-073745 | 3/2007 |
| JP | 2009-231505 | 10/2009 |
| KR | 10-2006-0069306 A | 6/2006 |
| KR | 10-2007-0004593 A | 1/2007 |
| KR | 10-2007-0004737 A | 1/2007 |
| KR | 10-2007-009938 A | 10/2007 |
| KR | 10-2009-0035796 A | 4/2009 |
| WO | WO-2009/072592 A1 | 6/2009 |
| WO | WO 2009150980 A1 * | 12/2009 |

OTHER PUBLICATIONS

Lee, H.M. "Silicon Thin-Film Solar Cell Technology" *Physics & High Technology*, Aug. 2008, pp. 15-19.

Notice of Allowance dated Sep. 23, 2011 in Korean Application No. 10-2009-0098333, filed Oct. 15, 2009.

Notice of Allowance dated Sep. 23, 2011 in Korean Application No. 10-2009-0106763, filed Nov. 6, 2009.

International Search Report in International Application No. PCT/KR2010/007086, filed Oct. 15, 2010.

European Search Report in European Application No. 10823627, dated Dec. 11, 2013.

Office Action in Japanese Application No. 2012-534116, dated Apr. 1, 2014.

Office Action dated Feb. 24, 2014 in Chinese Application No. 201080045937.0.

* cited by examiner

SOLAR CELL APPARATUS AND METHOD FOR MANUFACTURING THE SAME

CROSS-REFERENCE TO RELATED APPLICATIONS

This application is the U.S. national stage application of International Patent Application No. PCT/KR2010/007086, filed Oct. 15, 2010, which claims priority to Korean Application Nos. 10-2009-0098333, filed Oct. 15, 2009, and 10-2009-0106763, filed Nov. 6, 2009, the disclosures of each of which are incorporated herein by reference in their entirety.

TECHNICAL FIELD

The embodiment relates to a solar cell apparatus and a method for manufacturing the same.

BACKGROUND ART

Recently, as energy consumption is increased, a solar cell has been developed to convert solar energy into electrical energy.

In particular, a CIGS-based cell, which is a PN hetero junction apparatus having a substrate structure including a glass substrate, a metallic back electrode layer, a P type CIGS-based light absorbing layer, a high-resistance buffer layer, and an N type window layer, has been extensively used.

A plurality of cells are connected with each other in the solar cell and studies have been performed to improve electric characteristics of each cell.

DISCLOSURE

Technical Problem

The embodiment provides a solar cell apparatus having improved electric characteristics.

Technical Solution

A solar cell apparatus according to the embodiment includes a substrate; a back electrode layer on the substrate; a light absorbing layer on the back electrode layer; a front electrode layer on the light absorbing layer; and a connection wire extending from the front electrode layer and connected to the back electrode layer through the light absorbing layer, wherein the connection wire directly makes contact with an inner side of a recess formed in the back electrode layer.

A solar cell apparatus according to the embodiment includes a substrate; a back electrode layer on the substrate; an intermediate layer on the back electrode layer; a light absorbing layer on the intermediate layer; a front electrode layer on the light absorbing layer; and a connection wire extending from the front electrode layer and directly connected to the back electrode layer through the light absorbing layer and the intermediate layer.

A method for manufacturing a solar cell apparatus according to the embodiment includes the steps of forming a back electrode layer on a substrate; forming a light absorbing layer on the back electrode layer; forming a second perforation hole through the light absorbing layer and simultaneously forming a second recess by removing a part of the back electrode layer; and forming a front electrode layer on the light absorbing layer and forming a connection wire disposed in the second perforation hole and the second recess.

Advantageous Effects

According to the solar cell apparatus of the embodiment, a connection wire is connected to a recess formed in a back electrode layer. Thus, a contact area between the back electrode layer and the connection wire can be increased. In particular, an inner surface and/or a bottom surface of the recess may include a curved surface, so the contact area between the back electrode layer and the connection wire can be more increased.

In addition, an intermediate layer can be formed between the back electrode layer and the light absorbing layer. The intermediate layer can be formed through the reaction between the material included in the back electrode layer and the material included in the light absorbing layer.

The connection wire can be directly connected to the back electrode layer by passing through the intermediate layer. In particular, the intermediate layer may include $MoSe_2$ having high resistance. Thus, if the connection wire is directly connected to the back electrode layer, the connection characteristic between the back electrode layer and the connection wire can be improved when compared with the case in which the connection wire is connected to the back electrode layer through the intermediate layer.

Therefore, the solar cell apparatus according to the embodiment has the improved electric characteristics.

In addition, a process for forming a perforation hole in the light absorbing layer can be performed simultaneously with a process for forming a recess in the back electrode layer. Thus, the solar cell apparatus according to the embodiment can be readily manufactured.

BEST MODE

Mode for Invention

Figure 1:
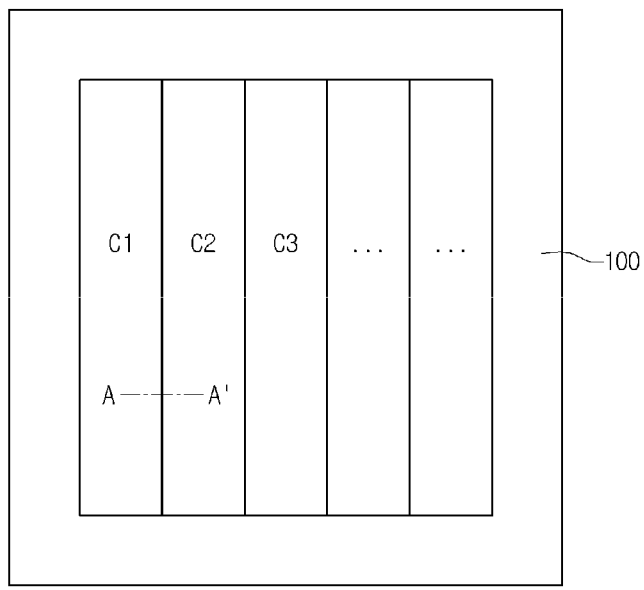
FIG. 1 is a plan view showing a solar cell apparatus according to the first embodiment.

In the description of the embodiments, it will be understood that, when a substrate, a layer (or film), or an electrode is referred to as being "on" or "under" another substrate, another layer (or film), or another electrode, it can be "directly" or "indirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 2:
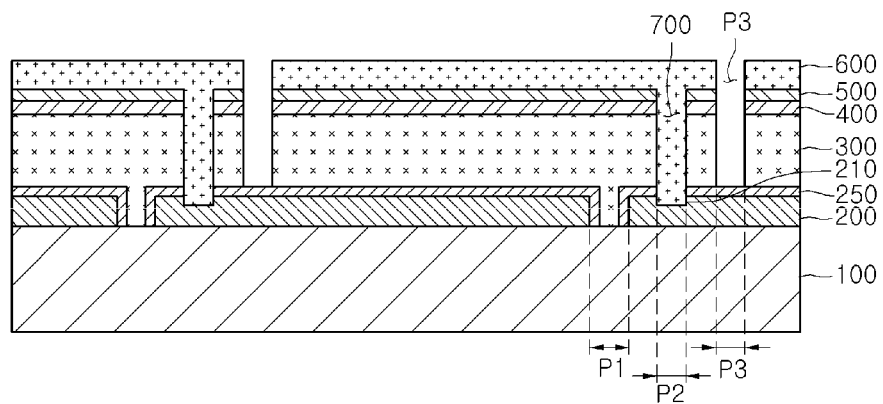
FIG. 2 is a sectional view taken along line A-A' of FIG. 1.

FIG. 1 is a plan view showing a solar cell apparatus according to the embodiment, and FIG. 2 is a sectional view taken along line A-A' of FIG. 1.

Referring to FIGS. 1 and 2, the solar cell apparatus according to the embodiment includes a substrate 100, a back electrode layer 200, an intermediate layer 250, a light absorbing layer 300, a buffer layer 400, a high-resistance buffer layer 500, a front electrode layer 600 and a plurality of connection wires 700.

The substrate 100 has a plate shape and supports the back electrode layer 200, the light absorbing layer 300, the buffer layer 400, the high-resistance buffer layer 500, the front electrode layer 600 and the connection wires 700.

The substrate 100 may include an insulating material. The substrate 100 may be a glass substrate, a plastic substrate or a metal substrate. In detail, the substrate 100 may be a soda lime glass. The substrate 100 may be transparent. The substrate 100 may be flexible or rigid.

The back electrode layer 200 is disposed on the substrate 100. The back electrode layer 200 may be a conductive layer. For instance, the back electrode layer 200 may include a metal, such as molybdenum.

In addition, the back electrode layer 200 may include at least two layers. In this case, the layers may be formed by using the homogeneous metal or heterogeneous metals.

First perforation holes P1 are formed in the back electrode layer 200. The first perforation holes P1 serve as an open region to expose the top surface of the substrate 100. When viewed from the top, the first perforation holes P1 extend in one direction.

The perforation holes P1 may have a width in the range of about 80 µm to about 200 µm.

The back electrode layer 200 is divided into a plurality of back electrodes by the first perforation holes P1. That is, the back electrodes are defined by the first perforation holes P1.

The back electrodes are spaced apart from each other by the first perforation holes P1. The back electrodes are arranged in the form of a stripe.

In addition, the back electrode can be arranged in the form of a matrix. When viewed from the top, the first perforation holes P1 are arranged in the form of a lattice.

The intermediate layer 250 is disposed on the back electrode layer 200. In detail, the intermediate layer 250 is disposed between the back electrode layer 200 and the light absorbing layer 300. The intermediate layer 250 may include a material contained in the back electrode layer 200 as well as a material contained in the light absorbing layer 300.

For instance, the intermediate layer 250 can be formed through the reaction between Mo contained in the back electrode layer 200 and Se contained in the light absorbing layer 300. In detail, the intermediate layer 250 may include $MoSe_2$.

The intermediate layer 250 may be an alloy layer including a molybdenum alloy. In addition, the intermediate layer 250 may serve as an interfacial layer between the back electrode layer 200 and the light absorbing layer 300. The intermediate layer 250 may be thinner than the back electrode layer 200 or the light absorbing layer 300.

The light absorbing layer 300 is disposed on the back electrode layer 200. A material included in the light absorbing layer 300 is filled in the first perforation holes P1.

The light absorbing layer 300 may include group I-III-VI compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 has an energy bandgap in the range of about 1 eV to about 1.8 eV.

The buffer layer 400 is disposed on the light absorbing layer 300. The buffer layer is disposed in the cell region A. When viewed from the top, the buffer layer 400 and the light absorbing layer 300 have the same shape. The buffer layer 400 includes CdS and has an energy bandgap in the range of about 2.2 eV to about 2.4 eV.

The high-resistance buffer layer 500 is disposed on the buffer layer 400. The high-resistance buffer layer 500 includes iZnO, which is zinc oxide not doped with impurities. The high-resistance buffer layer 500 has an energy bandgap in the range of about 3.1 eV to about 3.3 eV.

Second perforation holes P2 are formed in the intermediate layer 250, the light absorbing layer 300, the buffer layer 400 and the high-resistance buffer layer 500. The second perforation holes P2 are formed through the intermediate layer 250, the light absorbing layer 300, the buffer layer 400 and the high-resistance buffer layer 500.

The second perforation holes P2 are adjacent to the first perforation holes P1. That is, when viewed from the top, some second perforation holes P2 are formed next to the first perforation holes P1.

The second perforation holes P2 may have a width in the range of about 80 µm to about 200 µm.

In addition, a plurality of light absorbing parts are defined in the light absorbing layer 300 by the second perforation holes P2. That is, the light absorbing layer 300 is divided into a plurality of light absorbing parts by the second perforation holes P2.

A plurality of buffers are defined in the buffer layer 400 by the second perforation holes P2. That is, the buffer layer 400 is divided into a plurality of buffers by the second perforation holes P2. In addition, a plurality of high-resistance buffers are defined in the high-resistance buffer layer 500 by the second perforation holes P2.

A plurality of recesses 210 are formed in the back electrode layer 200. The recesses 210 can be formed by removing a part of the back electrode layer 200. Thus, a step portion is formed in the back electrode layer 200 by the recesses 210.

That is, bottom surfaces of the recesses 210 are disposed between top and bottom surfaces of the back electrode layer 200.

The recesses 210 are disposed below the second perforation holes P2, respectively. The recesses 210 are located corresponding to the second perforation holes P2, respectively. The recesses 210 are integrally formed with the second perforation holes P2, respectively. Thus, inner surfaces of the recesses 210 match with inner surfaces of the second perforation holes P2, respectively.

The recesses 210 may have a depth corresponding to about ¼ to about ½ based on the thickness of the back electrode layer 200. The recesses 210 may have a width substantially equal to the width of the second perforation holes P2, respectively.

The front electrode layer 600 is disposed on the high-resistance buffer layer 500. The front electrode layer 600 is a transparent conductive layer.

The front electrode layer 600 includes conductive oxide. For instance, the front electrode layer 600 may include zinc oxide, indium tin oxide (ITO) or indium zinc oxide (IZO).

In addition, the oxide may include conductive dopant, such as Al, $Al_2O_3$, Mg or Ga. In detail, the front electrode layer 60 may include Al doped zinc oxide (AZO) or Ga doped zinc oxide (GZO).

Third perforation holes P3 are formed in the light absorbing layer 300, the buffer layer 400, the high-resistance buffer layer 500 and the front electrode layer 600. The third perforation holes P3 may serve as an open region to expose the top surface of the intermediate layer 250. For instance, the third perforation holes P3 may have a width in the range of about 80 μm to about 200 μm.

The third perforation holes P3 are adjacent to the second perforation holes P2. In detail, the third perforation holes P3 are disposed next to the second perforation holes P2. In more detail, when viewed from the top, the third perforation holes P3 are disposed next to the second perforation holes P2 in parallel to the second perforation holes P2.

The front electrode layer 600 is divided into a plurality of front electrodes by the third perforation holes P3. That is, the front electrodes are defined in the front electrode layer 600 by the third perforation holes P3.

The front electrodes have shapes corresponding to shapes of the back electrodes. That is, the front electrodes are arranged in the form of a stripe. In addition, the front electrodes can be arranged in the form of a matrix.

Further, a plurality of cells C1, C2 . . . and Cn are defined by the third perforation holes P3. In detail, the cells C1, C2 . . . and Cn are defined by the second and third perforation holes P2 and P3. That is, the solar cell apparatus according to the embodiment is divided into the cells C1, C2 . . . and Cn by the second and third perforation holes P2 and P3.

The connection wires 700 extend from the front electrode layer 600 and passes through the intermediate layer 250, the light absorbing layer 300, the buffer layer 400 and the high-resistance buffer layer 500. The connection wires 700 are disposed inside the second perforation holes P2.

The connection wires 700 are directly connected to the back electrode layer 200. That is, the connection wires 700 directly make contact with the back electrode layer 200. In more detail, end portions of the connection wires 700 are inserted into the recesses 210, respectively. In addition, the connection wires 700 directly make contact with inner surfaces of the recesses 210, respectively. That is, the connection wires 700 directly make contact with the inner surfaces and bottom surfaces of the recesses 210.

Thus, the contact area between the connection wires 700 and the back electrode layer 200 may be increased. Therefore, the contact resistance can be reduced and the connection characteristics can be improved between the connection wires 700 and the back electrode layer 200.

The connection wires 700 connect adjacent cells with each other. In detail, the connection wires 700 connect front electrodes of the adjacent cells to the back electrodes of the adjacent cells.

The connection wires 700 are integrally formed with the front electrode layer 600. That is, the material used for the connection wires 700 is identical to the material used for the front electrode layer 600.

As described above, since the contact area between the connection wires 700 and the back electrode layer 200 is increased, the connection characteristics between the connection wires 700 and the back electrode layer 200 can be improved.

In addition, the connection wires 700 extend by passing through the intermediate layer 250, so the connection wires 700 can be directly connected to the back electrode layer 200. Since the intermediate layer 250 has the high resistance, the resistance between the connection wires 700 and the back electrode layer 200 may be increased if the connection wires 700 are connected to the back electrode layer 200 through the intermediate layer 250.

According to the solar cell apparatus of the embodiment, the connection wires 700 are directly connected to the back electrode layer 200, so the resistance can be lowered and the electric characteristics can be improved.

The solar cell apparatus according to the embodiment can reduce the resistance among the cells C1, C2 . . . , and Cn. In addition, the solar cell apparatus according to the embodiment may have the improved electric characteristics and higher photoelectric conversion efficiency.

FIGS. 3 to 9 are sectional views showing a method for manufacturing the solar cell apparatus according to the first embodiment. The previous description about the solar cell apparatus will be incorporated herein by reference.

Figure 3:
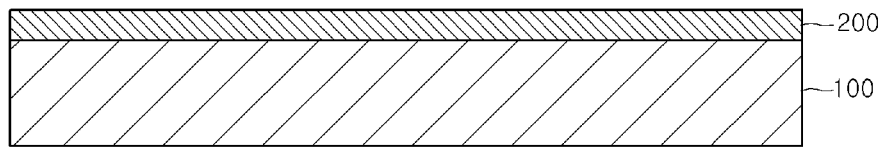
FIGS. 3 to 9 are sectional views showing a method for manufacturing a solar cell apparatus according to the first embodiment.

Referring to FIG. 3, the back electrode layer 200 is formed on the substrate 100.

The substrate 100 may include glass. A ceramic substrate, a metal substrate or a polymer substrate may be used as the substrate 100.

For instance, the glass substrate may include soda lime glass or high strained point soda glass, the metal substrate may include stainless steel or titanium, and the polymer substrate may include polyimide.

The substrate 100 may be transparent. The substrate 100 may be rigid or flexible.

The back electrode layer 200 may include a conductor, such as a metal.

For instance, the back electrode layer 200 can be performed through the sputtering process by using molybdenum (Mo) as a target.

Since the molybdenum (Mo) has the high electric conductivity, the molybdenum can improve the ohmic contact with respect to the light absorbing layer 300 and can maintain high-temperature stability under the Se atmosphere.

The molybdenum (Mo) layer serving as the back electrode layer 200 must have a low specific resistance as an electrode and must have high adhesive property with respect to the substrate 100 such that the delamination phenomenon may not occur due to the difference of the thermal expansion coefficient.

For instance, the back electrode layer 200 may have a thickness in the range of about 900 nm to about 1100 nm and a surface resistance of about 0.3Ω/□.

Meanwhile, the back electrode layer 200 can be formed by using molybdenum (Mo) doped with sodium ions.

Although not shown in the drawings, the back electrode layer 200 may include at least one layer. If the back electrode layer 200 includes a plurality of layers, the layers may be formed by using materials different from each other.

Figure 4:
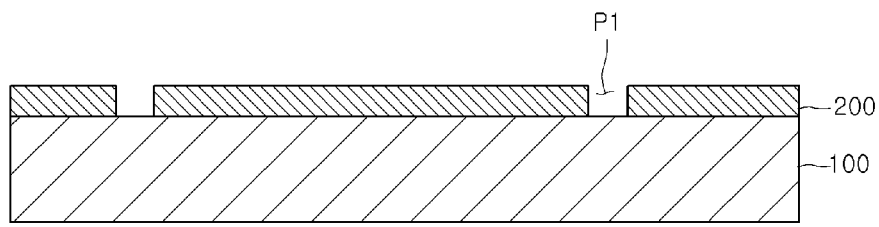

Referring to FIG. 4, first perforation holes P1 are formed in the back electrode layer 200 so that the back electrode layer 200 is patterned into a plurality of back electrodes.

The first perforation holes P1 may selectively expose the top surface of the substrate 100.

For instance, the first perforation holes P1 can be patterned by a mechanical device or a laser device. The first perforation holes P1 may have a width in the range of about 60 μm to about 100 μm.

The back electrode layer 200 can be patterned in the form of a stripe or a matrix by the first perforation holes P1 and may correspond to each cell.

Meanwhile, the back electrode layer 200 may have various shapes in addition to the above shapes.

Figure 5:
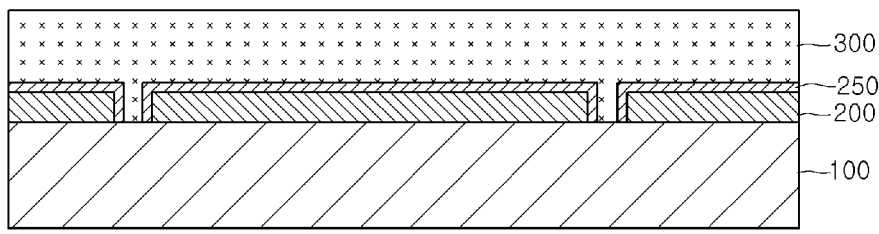

Referring to FIG. 5, the light absorbing layer 300 is formed on the back electrode layer 200. The light absorbing layer 300 may include group I-III-VI compounds. For instance, the light absorbing layer 300 may include Cu(In,Ga)Se$_2$ (CIGS) compounds.

In addition, the light absorbing layer 300 may include Cu(In)Se$_2$ (CIS) compound or Cu(Ga)Se$_2$ (CGS) compound.

For instance, in order to form the light absorbing layer 300, a CIG metal precursor layer is formed on the back electrode layer 200 by using a Cu target, an In target, and a Ga target.

After that, the metal precursor layer reacts with Se through the selenization process, so that the CIGS light absorbing layer is formed.

In addition, the light absorbing layer 300 can be formed by co-evaporating Cu, In, Ga and Se.

For instance, the light absorbing layer 300 may have a thickness in the range of about 1500 nm to about 2500 nm.

The light absorbing layer 300 receives external light to convert the external light into electric energy. The light absorbing layer 300 generates optical electromotive force through the photoelectric conversion effect.

Meanwhile, when the selenization process is performed with respect to the light absorbing layer 300, metal elements of the back electrodes may react with elements of the light absorbing layer 300, so that the metal elements of the back electrodes may be bonded with the elements of the light absorbing layer 300. As a result, the intermediate layer 250, which is an intermetallic compound, is formed between the back electrode layer 200 and the light absorbing layer 300.

For instance, the intermediate layer 250 may include $MoSe_2$, which is a compound of Mo and Se.

The intermediate layer 250 is formed at the interfacial surface between the light absorbing layer 300 and the back electrode layer 200 to protect the top surface of the back electrode layer 200.

Since the intermediate layer 250 is not formed on the surface of the substrate 100 exposed through the first perforation holes P1, the light absorbing layer 300 may be gap-filled in the first perforation holes P1.

The $MoSe_2$ used for the intermediate layer 250 has the surface resistance higher than that of the Mo layer serving as the back electrode layer 200. Thus, the intermediate layer 250 making contact with the front electrodes must be partially removed in order to improve the ohmic contact characteristics with respect to the front electrodes.

Figure 6:
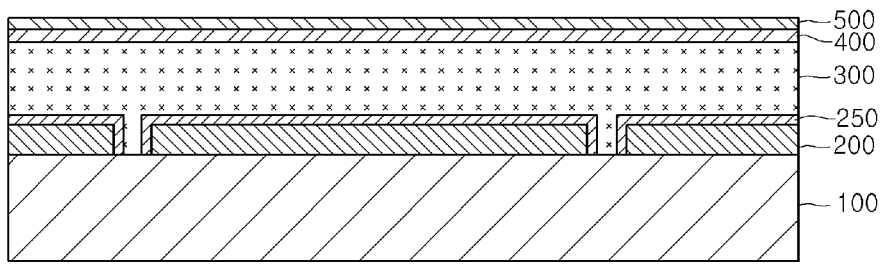

Referring to FIG. 6, the buffer layer 400 and the high-resistance buffer layer 500 are formed on the light absorbing layer 300.

The buffer layer 400 formed on the light absorbing layer 300 may include at least one layer. The buffer layer 400 can be formed by depositing CdS through the CBD (chemical bath deposition) process.

The buffer layer 400 is an N type semiconductor layer and the light absorbing layer 300 is a P type semiconductor layer. Thus, a PN junction is formed by the light absorbing layer 300 and the buffer layer 400.

The high-resistance buffer layer 500 is formed on the buffer layer 400 as a transparent electrode layer.

For instance, the high-resistance buffer layer 500 may include one of ITO, ZnO and i-ZnO.

The high-resistance buffer layer 500 can be formed as a ZnO layer by performing the sputtering process using ZnO as a target.

The buffer layer 400 and the high-resistance buffer layer 500 are disposed between the light absorbing layer 300 and the front electrode, which will be formed later.

That is, since there are great difference in the lattice constant and the energy bandgap between the light absorbing layer 300 and the front electrode, if the buffer layer 400 and the high-resistance buffer layer 500 having the intermediate bandgap are disposed between the light absorbing layer 300 and the front electrode, the superior junction property can be obtained.

According to the present embodiment, two buffer layers 400 and 500 are formed on the light absorbing layer 300. However, the embodiment is not limited thereto. For instance, one buffer layer can be formed on the light absorbing layer 300.

Figure 7:
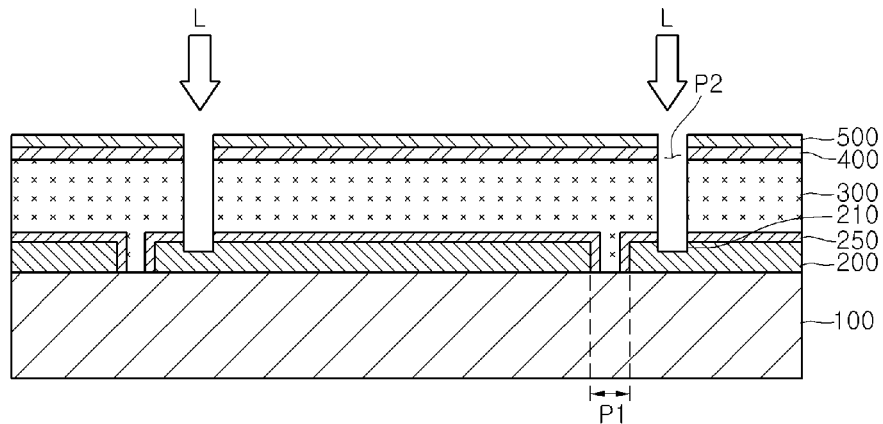

Referring to FIG. 7, the second perforation holes P2 are formed through the high-resistance buffer layer 500, the buffer layer 400, the light absorbing layer 300 and the intermediate layer 250. The second perforation holes P2 can expose the back electrode layer 200.

In addition, the back electrode layer 200 is partially removed when the second perforation holes P2 are formed, so that a plurality of recesses 210 can be formed.

The second perforation holes P2 and the recesses 210 are aligned adjacent to the first perforation holes P1. For instance, the second perforation holes P2 may have a width in the range of about 60 μm to about 100 μm. In addition, a gap between the first and second perforation holes P1 and P2 is in the range of about 60 μm to about 100 μm.

Since the recesses 210 are formed by partially etching the back electrode layer 200, the top surface of the back electrode layer 200 may have a step portion. That is, the surface area of the back electrode layer 200 may be increased due to the recesses 210.

In addition, the intermediate layer 250 is partially removed when forming the second perforation holes P2, so that the back electrodes can be exposed. In particular, since the back electrode layer 200 is also partially removed, a part of the intermediate layer 250 corresponding to the second perforation holes P2 may be completely removed.

The second perforation holes P2 and the recesses 210 can be simultaneously formed through the laser process. That is, the second perforation holes P2 and the recesses 210 can be formed by sequentially irradiating laser beams onto the light absorbing layer 300 and the back electrode layer 200.

Figure 8:
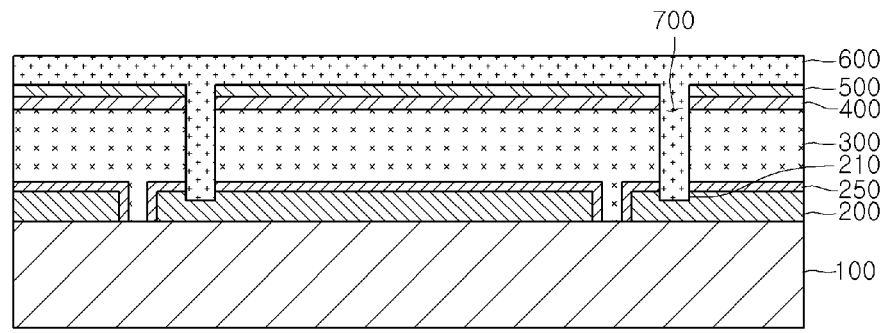

Referring to FIG. 8, a transparent conductive material is deposited on the high-resistance buffer layer 500 so that the front electrode layer 600 is formed. When the front electrode layer 600 is formed, the transparent conductive material is filled in the second perforation holes P2 and the recesses 210. Thus, the connection wires 700 are formed in the second perforation holes P2 and the recesses 210.

The connection wires 700 are directly connected to the back electrodes through the second perforation holes P2. In addition, the contact area between the connection wires 700 and the back electrode layer 200 can be increased due to the recesses 210.

As a result, the ohmic contact characteristic between the connection wires 700 and the back electrode layer 200 can be improved. Especially, the mobility and conductivity of the current flowing through the surface of the back electrode layer 200 serving as a back contact of the solar cell apparatus according to the embodiment can be improved.

The front electrode layer 600 can be formed by performing the sputtering process using Al or ZnO doped with $Al_2O_3$.

The front electrode layer 600 is a window layer that forms the PN junction together with the light absorbing layer 300. Since the front electrode layer 600 serves as a transparent electrode at the front of the solar cell, the front electrode layer 600 is formed by using ZnO having high light transmittance and superior electric conductivity.

Therefore, the electrode having a low resistance value can be formed by doping the ZnO with Al or $Al_2O_3$.

The ZnO layer serving as the front electrode layer 600 can be formed through the RF sputtering process using the ZnO target, the reactive sputtering process using the Zn target or the organic metal chemical deposition process.

In addition, the front electrode layer 600 may have a dual structure by depositing an ITO layer having the superior photoelectric property on the ZnO layer.

Figure 9:
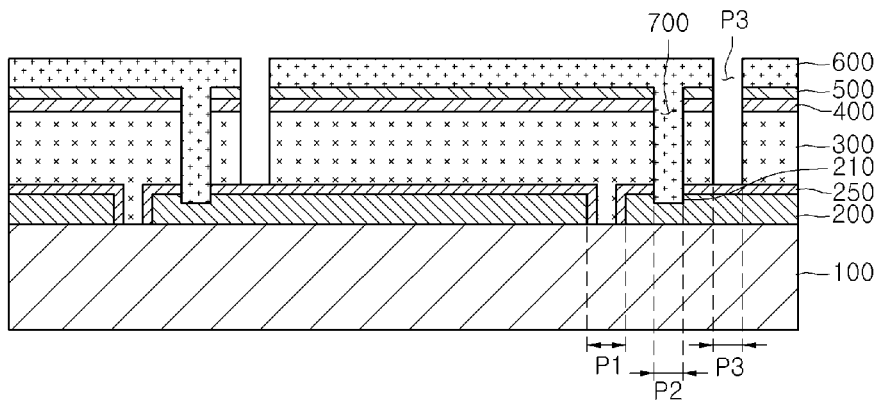

Referring to FIG. 9, the third perforation holes P3 are formed through the front electrode layer 600, the high-resistance buffer layer 500, the buffer layer 400 and the light absorbing layer 300.

The third perforation holes P3 can selectively expose the intermediate layer 250. The third perforation holes P3 are aligned adjacent to the second perforation holes P2.

For instance, the third perforation holes P3 may have a width in the range of about 60 μm to about 100 μm. In addition, a gap between the second and third perforation holes P2 and P3 is in the range of about 60 μm to about 100 μm.

The third perforation holes P3 can be formed through the laser irradiation scheme or the mechanical scheme by using a tip. When the third perforation holes P3 are formed through the mechanical scheme, the surface of the back electrode layer 200 can be protected by the intermediate layer 250.

That is, since the intermediate layer 250 is formed on the surface of the back electrode layer 200, the intermediate layer 250 may serve as a lubricant when the etching process is performed by using the tip, so that the back electrode layer 200 can be prevented from being damaged.

The cells C1, C2 . . . and Cn are defined by the third perforation holes P3. In addition, the cells C1, C2 . . . and Cn are connected with each other by the connection wires 700. In detail, the connection wires 700 may physically or electrically connect the front electrodes of adjacent cells to the back electrodes of the adjacent cells.

The ohmic contact characteristic between the back electrodes and the front electrodes can be improved by selectively removing the $MoSe_2$ layer formed on the back electrodes.

In addition, the $MoSe_2$ layer may prevent the back electrode layer 200 from being damaged.

Thus, the solar cell apparatus having the improved electric characteristics can be provided.

Figure 10:
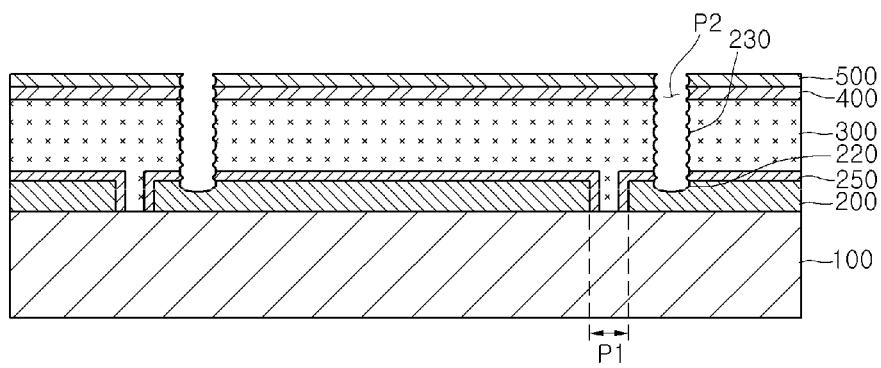
FIGS. 10 and 11 are sectional views showing a method for manufacturing a solar cell apparatus according to the second embodiment.
Figure 11:
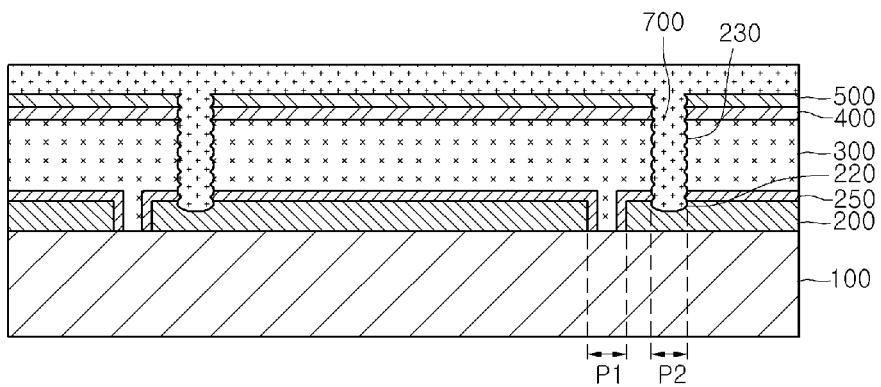

FIGS. 10 and 11 are sectional views showing a method for manufacturing a solar cell apparatus according to the second embodiment. As shown in FIGS. 10 and 11, a plurality of curved surfaces can be formed at inner surfaces of the second perforation holes P2 and recesses 220.

In detail, as shown in FIG. 10, the second perforation holes P2 are formed through the laser process, so a plurality of grooves 230 including curved surfaces can be formed at the inner surfaces of the second perforation holes P2.

In more detail, the grooves 230 can be formed at the inner surfaces of the high-resistance buffer layer 500, the buffer layer 400, the light absorbing layer 300 and the intermediate layer 250 exposed through the second perforation holes P2.

Due to the grooves 230, the surface area of the sidewalls of the second perforation holes P2 may be increased so that the contact characteristics with respect to the connection wires 700 to be formed later can be improved.

In addition, the curved surfaces can be formed at the lateral sides and/or bottom surfaces of the recesses 220 extending from the second perforation holes P2. Since the lateral sides and/or bottom surfaces of the recesses 220 include the curved surfaces, the contact area between the connection wires 700 and the back electrode layer 200 can be increased and the contact characteristics can be improved.

The curved surfaces can be formed at the grooves 230 and the recesses 220 due to the energy and wavelength of laser beams during the laser process. That is, the intermediate layer 250 is removed through the laser process, and simultaneously, a plurality of curved surfaces are formed at the inner surfaces of the second perforation holes P2 and the recesses 220.

Especially, the depth of the grooves 230 and the recesses 220 can be adjusted by controlling the energy and power of the laser beam.

Referring to FIG. 11, the transparent conductive material is deposited on the high-resistance buffer layer 500, so that the front electrode layer 600 is formed. When the front electrode layer 600 is formed, the transparent conductive material is filled in the second perforation holes P2 and the recesses 210. Thus, the connection wires 700 are formed in the second perforation holes P2 and the recesses 210.

The method for forming the front electrode layer 600 and the connection wires 700 is equal to the method shown in FIG. 8, so detailed description thereof will be omitted in order to avoid redundancy.

The connection wires 700 can be directly connected to the back electrode layer 200 through the second perforation holes P2.

In addition, the contact strength between the connection wires 700 and the second perforation holes P2 can be reinforced due to the grooves 230. This is because the surface area of the second perforation holes P2 is increased due to the grooves 230.

Further, the contact characteristics between the connection wires 700 and the back electrode layer 200 can be improved due to the recesses 220. This is because the area of the inner surfaces of the recesses 220 is increased due to the curved surfaces formed at the bottom surfaces of the recesses 220.

Therefore, the ohmic contact characteristic between the connection wires 700 and the back electrode layer 200 can be improved. Especially, the mobility and conductivity of the current flowing through the surface of the back electrode layer 200 serving as a back contact of the solar cell apparatus according to the embodiment can be improved. Then, a process for forming the third perforation holes P3 shown in FIG. 9 is performed.

Thus, the solar cell apparatus having the improved electric characteristics can be provided.

Figure 12:
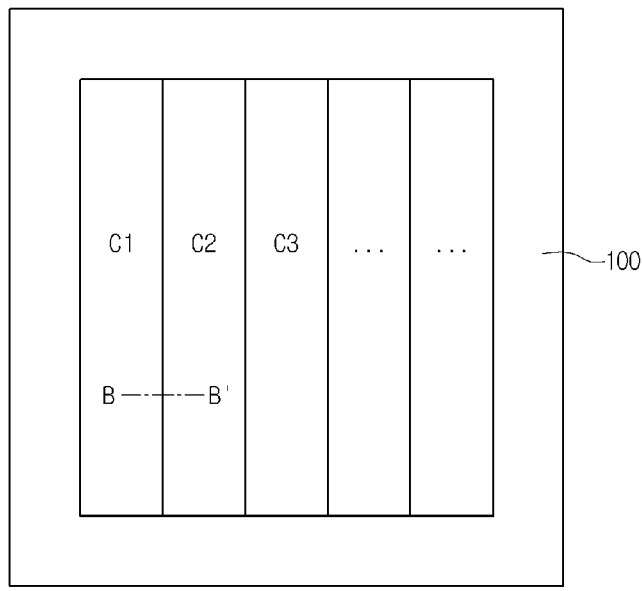
FIG. 12 is a plan view showing a solar cell apparatus according to the third embodiment.
Figure 13:
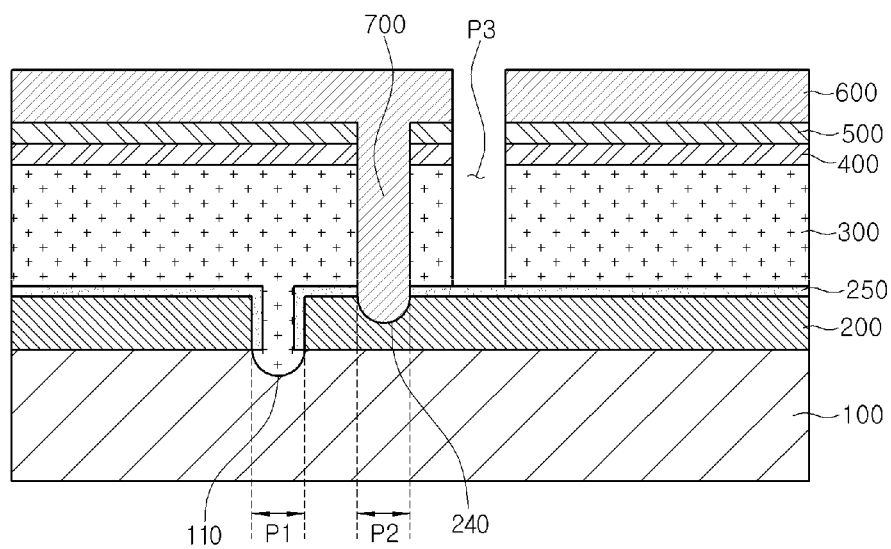
FIG. 13 is a sectional view taken along line B-B' of FIG. 12.

FIG. 12 is a plan view showing a solar cell apparatus according to the third embodiment, and FIG. 13 is a sectional view taken along line B-B' of FIG. 12. The previous description about the solar cell apparatus will be incorporated herein by reference.

Referring to FIGS. 12 and 13, the solar cell apparatus according to the third embodiment includes a substrate 100, a back electrode layer 200, an intermediate layer 250, a light absorbing layer 300, a buffer layer 400, a front electrode layer 600 and a plurality of connection wires 700.

The substrate 100 has a plate shape and supports the back electrode layer 200, the light absorbing layer 300, the buffer layer 400, the front electrode layer 600 and the connection wires 700.

The substrate 100 may include an insulating material. The substrate 100 may be a glass substrate, a plastic substrate or a metal substrate. In detail, the substrate 100 may be a soda lime glass. The substrate 100 may be transparent. The substrate 100 may be flexible or rigid.

The back electrode layer 200 is disposed on the substrate 100. The back electrode layer 200 may be a conductive layer. For instance, the back electrode layer 200 may include a metal, such as molybdenum.

In addition, the back electrode layer 200 may include at least two layers. In this case, the layers may be formed by using the homogeneous metal or heterogeneous metals.

First perforation holes P1 are formed in the back electrode layer 200. The first perforation holes P1 serve as an open region to expose the top surface of the substrate 100. When viewed from the top, the first perforation holes P1 extend in one direction.

The perforation holes P1 may have a width in the range of about 80 μm to about 200 μm.

The back electrode layer 200 is divided into a plurality of back electrodes by the first perforation holes P1. That is, the back electrodes are defined by the first perforation holes P1.

The back electrodes are spaced apart from each other by the first perforation holes P1. The back electrodes are arranged in the form of a stripe.

In addition, the back electrode can be arranged in the form of a matrix. When viewed from the top, the first perforation holes P1 are arranged in the form of a lattice.

The first perforation holes P1 may have uniform inner surfaces. That is, inner surfaces of the first perforation holes P1 may be smooth.

A plurality of first recesses 110 may be formed in the substrate 100 corresponding to the first perforation holes P1. In detail, the first recesses 110 are formed by removing a part of the substrate 100 when the first perforation holes P1 are formed. The first recesses 110 are integrally formed with the first perforation holes P1.

In addition, a step portion is formed on the top surface of the substrate 100 due to the first recesses 110. For instance, the first recesses 110 are concaved with respect to the top surface of the substrate 100. Inner surfaces of the first recesses 110 may include curved surfaces. That is, the curved surfaces may be formed at the inner surfaces and the bottom surface of the first recesses 110. In detail, the inner surfaces of the first recesses 110 may be the curved surfaces. In more detail, the first recesses 110 may have a partially-cut circular sectional shape.

The intermediate layer 250 is disposed on the back electrode layer 200. In detail, the intermediate layer 250 is disposed between the back electrode layer 200 and the light absorbing layer 300. The intermediate layer 250 may include a material contained in the back electrode layer 200 as well as a material contained in the light absorbing layer 300.

For instance, the intermediate layer 250 can be formed through the reaction between Mo contained in the back electrode layer 200 and Se contained in the light absorbing layer 300. In detail, the intermediate layer 250 may include $MoSe_2$.

The intermediate layer 250 may be an alloy layer including a molybdenum alloy. In addition, the intermediate layer 250 may serve as an interfacial layer between the back electrode layer 200 and the light absorbing layer 300. The intermediate layer 250 may be thinner than the back electrode layer 200 or the light absorbing layer 300.

The light absorbing layer 300 is disposed on the back electrode layer 200. A material included in the light absorbing layer 300 is filled in the first perforation holes P1.

The light absorbing layer 300 may include group I-III-VI compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 has an energy bandgap in the range of about 1 eV to about 1.8 eV.

The buffer layer 400 is disposed on the light absorbing layer 300. The buffer layer 400 is disposed in the cell region A. When viewed from the top, the buffer layer 400 and the light absorbing layer 300 have the same shape. The buffer layer 400 includes CdS and has an energy bandgap in the range of about 2.2 eV to about 2.4 eV.

The high-resistance buffer layer 500 is disposed on the buffer layer 400. The high-resistance buffer layer 500 includes iZnO, which is zinc oxide not doped with impurities.

The high-resistance buffer layer 500 has an energy bandgap in the range of about 3.1 eV to about 3.3 eV.

Second perforation holes P2 are formed in the intermediate layer 250, the light absorbing layer 300, the buffer layer 400 and the high-resistance buffer layer 500. The second perforation holes P2 are formed through the intermediate layer 250, the light absorbing layer 300, the buffer layer 400 and the high-resistance buffer layer 500.

The second perforation holes P2 may have uniform inner surfaces. That is, inner surfaces of the second perforation holes P2 may be smooth.

The second perforation holes P2 are adjacent to the first perforation holes P1. That is, when viewed from the top, some second perforation holes P2 are formed next to the first perforation holes P1.

The second perforation holes P2 may have a width in the range of about 80 μm to about 200 μm.

In addition, a plurality of light absorbing parts are defined in the light absorbing layer 300 by the second perforation holes P2. That is, the light absorbing layer 300 is divided into a plurality of light absorbing parts by the second perforation holes P2.

A plurality of light absorbing parts are defined in the light absorbing layer 300 by the second perforation holes P2. That is, the light absorbing layer 300 is divided into a plurality of light absorbing parts by the second perforation holes P2.

A plurality of buffers are defined in the buffer layer 400 by the second perforation holes P2. That is, the buffer layer 400 is divided into a plurality of buffers by the second perforation holes P2. In addition, a plurality of high-resistance buffers are defined in the high-resistance buffer layer 500 by the second perforation holes P2.

A plurality of second recesses 240 are formed in the back electrode layer 200. The second recesses 240 can be formed by removing a part of the back electrode layer 200. Thus, a step portion is formed in the back electrode layer 200 by the second recesses 240.

The second recesses 240 are concaved with respect to the top surface of the substrate 100. Inner surfaces of the second recesses 240 may include curved surfaces. That is, the curved surfaces may be formed at the inner surfaces and the bottom surface of the second recesses 240. In detail, the inner surfaces of the second recesses 240 may be the curved surfaces. In more detail, the second recesses 240 may have a partially-cut circular sectional shape.

The second recesses 240 are disposed below the second perforation holes P2, respectively. The second recesses 240 are located corresponding to the second perforation holes P2, respectively. The second recesses 240 are integrally formed with the second perforation holes P2, respectively. Thus, inner surfaces of the second recesses 240 match with inner surfaces of the second perforation holes P2, respectively.

The second recesses 240 may have a depth corresponding to about ¼ to about ½ based on the thickness of the back electrode layer 200. The second recesses 240 may have a width substantially equal to the width of the second perforation holes P2, respectively.

The front electrode layer 600 is disposed on the buffer layer 400. The front electrode layer 600 is a transparent conductive layer. The front electrode layer 600 includes conductive oxide. For instance, the front electrode layer 600 may include zinc oxide, indium tin oxide (ITO) or indium zinc oxide (IZO).

In addition, the oxide may include conductive dopant, such as Al, $Al_2O_3$, Mg or Ga. In detail, the front electrode layer 60 may include Al doped zinc oxide (AZO) or Ga doped zinc oxide (GZO).

Third perforation holes P3 are formed in the light absorbing layer 300, the buffer layer 400, the high-resistance buffer layer 500 and the front electrode layer 600. The third perforation holes P3 may serve as an open region to expose the top surface of the intermediate layer 250. For instance, the third perforation holes P3 may have a width in the range of about 80 μm to about 200 μm.

The third perforation holes P3 are adjacent to the second perforation holes P2. In detail, the third perforation holes P3 are disposed next to the second perforation holes P2. In more detail, when viewed from the top, the third perforation holes P3 are disposed next to the second perforation holes P2 in parallel to the second perforation holes P2.

The front electrode layer 600 is divided into a plurality of front electrodes by the third perforation holes P3. That is, the front electrodes are defined in the front electrode layer 600 by the third perforation holes P3.

The front electrodes have shapes corresponding to shapes of the back electrodes. That is, the front electrodes are arranged in the form of a stripe. In addition, the front electrodes can be arranged in the form of a matrix.

Further, a plurality of cells C1, C2 . . . and Cn are defined by the third perforation holes P3. In detail, the cells C1, C2 . . . and Cn are defined by the second and third perforation holes P2 and P3. That is, the solar cell apparatus according to the embodiment is divided into the cells C1, C2 . . . and Cn by the second and third perforation holes P2 and P3.

The connection wires 700 extend from the front electrode layer 600 and passes through the intermediate layer 250, the light absorbing layer 300, the buffer layer 400 and the high-resistance buffer layer 500. The connection wires 700 are disposed inside the second perforation holes P2.

The connection wires 700 are directly connected to the back electrode layer 200. That is, the connection wires 700 directly make contact with the back electrode layer 200. In more detail, end portions of the connection wires 700 are inserted into the second recesses 240, respectively. In addition, the connection wires 700 directly make contact with inner surfaces of the second recesses 240, respectively. That is, the connection wires 700 directly make contact with the inner surfaces and bottom surfaces of the second recesses 240.

Thus, the contact area between the connection wires 700 and the back electrode layer 200 may be increased. Therefore, the contact resistance can be reduced and the connection characteristics can be improved between the connection wires 700 and the back electrode layer 200.

The connection wires 700 connect adjacent cells with each other. In detail, the connection wires 700 connect front electrodes of the adjacent cells to the back electrodes of the adjacent cells.

The connection wires 700 are integrally formed with the front electrode layer 600. That is, the material used for the connection wires 700 is identical to the material used for the front electrode layer 600.

As described above, since the contact area between the connection wires 700 and the back electrode layer 200 is increased, the connection characteristics between the connection wires 700 and the back electrode layer 200 can be improved.

In addition, the connection wires 700 extend by passing through the intermediate layer 250, so the connection wires 700 can be directly connected to the back electrode layer 200. Since the intermediate layer 250 has the high resistance, the resistance between the connection wires 700 and the back electrode layer 200 may be increased if the connection wires 700 are connected to the back electrode layer 200 through the intermediate layer 250.

According to the solar cell apparatus of the embodiment, the connection wires 700 are directly connected to the back electrode layer 200, so the resistance can be lowered and the electric characteristics can be improved.

The solar cell apparatus according to the embodiment can reduce the resistance among the cells C1, C2 . . . , and Cn. In addition, the solar cell apparatus according to the embodiment may have the improved electric characteristics and higher photoelectric conversion efficiency.

FIGS. 14 to 23 are sectional views showing a method for manufacturing the solar cell apparatus according to the third embodiment. The previous description about the solar cell apparatus will be incorporated herein by reference.

Figure 14:
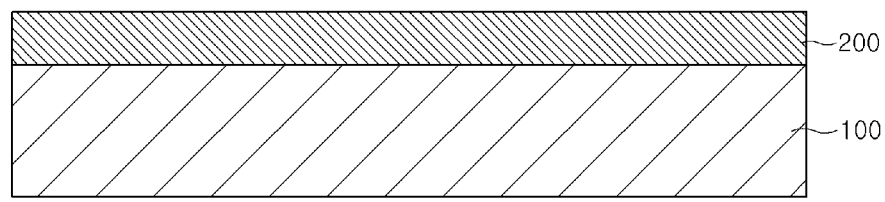
FIGS. 14 to 23 are sectional views showing a method for manufacturing a solar cell apparatus according to the third embodiment.

Referring to FIG. 14, the back electrode layer 200 is formed on the substrate 100.

The substrate 100 may include glass. A ceramic substrate, a metal substrate or a polymer substrate may be used as the substrate 100.

For instance, the glass substrate may include soda lime glass or high strained point soda glass, the metal substrate may include stainless steel or titanium, and the polymer substrate may include polyimide.

The substrate 100 may be transparent. The substrate 100 may be rigid or flexible.

The back electrode layer 200 may include a conductor, such as a metal.

For instance, the back electrode layer 200 can be performed through the sputtering process by using molybdenum (Mo) as a target.

Since the molybdenum (Mo) has the high electric conductivity, the molybdenum can improve the ohmic contact with respect to the light absorbing layer 300 and can maintain high-temperature stability under the Se atmosphere.

The molybdenum (Mo) layer serving as the back electrode layer 200 must have a low specific resistance as an electrode and must have high adhesive property with respect to the substrate 100 such that the delamination phenomenon may not occur due to the difference of the thermal expansion coefficient.

Meanwhile, the back electrode layer 200 can be formed by using molybdenum (Mo) doped with sodium ions.

Although not shown in the drawings, the back electrode layer 200 may include at least one layer. If the back electrode layer 200 includes a plurality of layers, the layers may be formed by using materials different from each other.

Figure 15:
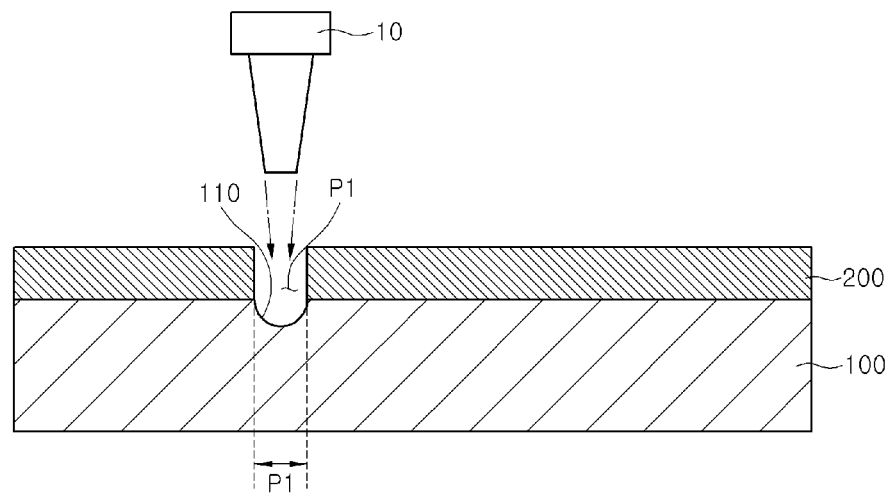

Referring to FIG. 15, first perforation holes P1 are formed in the back electrode layer 200. The back electrode layer 200 is electrically and physically divided by the first perforation holes P1. The first perforation holes P1 may selectively expose the substrate 100.

The first recesses 110 are formed in the substrate 110 by partially removing an upper portion of the substrate 110. The first recesses 110 may extend from the first perforation holes P1.

That is, the back electrode layer 200 is divided by the first perforation holes P1 and the step portion is formed on the top surface of the substrate 100 due to the first recesses 110.

The first recesses 110 are concaved with respect to the top surface of the substrate 100 and curved surfaces may be formed on the bottom surfaces of the first recesses 110.

The first perforation holes P1 may be formed through the isotropic etching process.

For instance, the first perforation holes P1 can be formed by performing the wet etching process using water-jet. That is, the first perforation holes P1 and the first recesses 110 are formed by sequentially spraying high-pressure etchant onto the back electrode layer 200 and the substrate 100.

In detail, the back electrode layer 200 is selectively removed by the water-jet, so that the first perforation holes P1 are formed. At this time, the substrate 100 formed at a lower portion of the first perforation holes P1 is also etched, so that the first recesses 110 are formed.

Especially, since the substrate 100 is isotropically etched through the water jet process, the curved surfaces can be formed at the bottom surfaces of the first recesses 110.

In general, when the laser process or the scribing process using the tip is performed, the back electrode layer 200 may be delaminated from the substrate 100 due to the difference in thermal expansion coefficient between the substrate 100 and the back electrodes.

According to the present embodiment, the first perforation holes P1 are formed through the wet etching process using the water-jet, so that the back electrode layer 200 divided by the first perforation holes P1 may not be delaminated from the substrate 100.

In addition, since the first perforation holes P1 are formed through the wet etching process using the water-jet, the first perforation holes P1 may have uniform inner surfaces.

Figure 16:
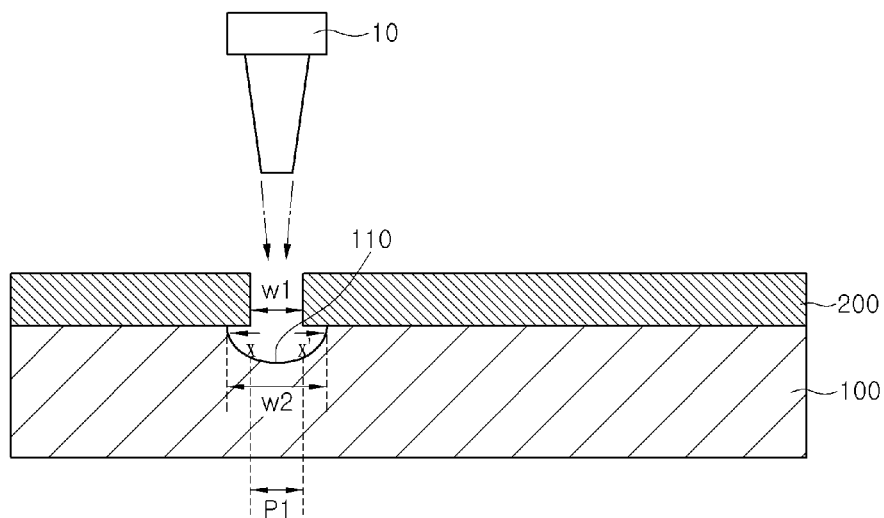

Further, referring to FIG. 16, if the water jet process time is lengthened, the etchant may penetrate into the substrate 100 in the lateral direction (x-x') of the substrate 100, so that the substrate 100 is isotropically etched.

Therefore, the first recesses 110 have a width wider than a width of the first perforation holes P1. In detail, the first perforation holes P1 have a first width w1 and the first recesses 110 have a second width w2 wider than the first width w1.

For instance, the first perforation holes P1 may have a width in the range of about 40 μm to about 80 μm and the first recesses 110 have a width in the range of about 60 μm to about 100 μm.

The back electrode layer 200 can be patterned in the form of a stripe or a matrix by the first perforation holes P1 and may correspond to each cell.

Meanwhile, the back electrode layer 200 may have various shapes in addition to the above shapes. Then, the cleaning and drying processes are performed with respect to the back electrode layer 200 and the first perforation holes P1.

Since the first perforation holes P1 are formed through the isotropic etching process using the water-jet, the residues of the back electrode layer 200 may be reduced and the residues can be removed by using the water-jet.

Thus, the electric short between adjacent back electrodes can be prevented.

Figure 17:
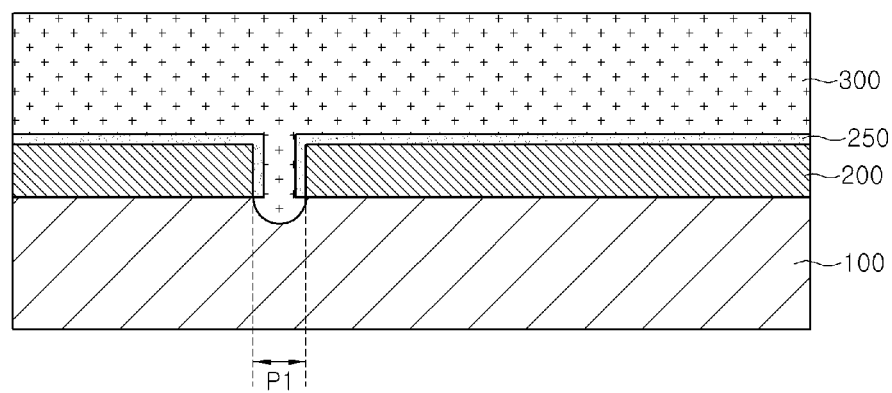

Referring to FIG. 17, the light absorbing layer 300 is formed on the back electrode layer 200 and the first perforation holes P1. The light absorbing layer 300 may include group I-III-VI compounds.

For instance, the light absorbing layer 300 may include $Cu(In,Ga)Se_2$ (CIGS) compounds.

In addition, the light absorbing layer 300 may include $Cu(In)Se_2$ (CIS) compound or $Cu(Ga)Se_2$ (CGS) compound.

For instance, in order to form the light absorbing layer 300, a CIG metal precursor layer is formed on the back electrode layer 200 and in the first perforation holes P1 by using a Cu target, an In target, and a Ga target.

After that, the metal precursor layer reacts with Se through the selenization process, so that the CIGS light absorbing layer is formed.

In addition, the light absorbing layer 300 can be formed by co-evaporating Cu, In, Ga and Se.

The light absorbing layer 300 receives external light to convert the external light into electric energy. The light absorbing layer 300 generates optical electromotive force through the photoelectric conversion effect.

Meanwhile, when the selenization process is performed with respect to the light absorbing layer 300, metal elements of the back electrodes may react with elements of the light absorbing layer 300, so that the metal elements of the back electrodes may be bonded with the elements of the light absorbing layer 300. As a result, the intermediate layer 250, which is an intermetallic compound, is formed on the back electrode layer 200.

For instance, the intermediate layer 250 may include $MoSe_2$, which is a compound of Mo and Se.

The intermediate layer 250 is formed at the interfacial surface between the light absorbing layer 300 and the back electrode layer 200 to protect the top surface of the back electrode layer 200.

Since the intermediate layer 250 is not formed on the surface of the substrate 100 exposed through the first perforation holes P1, the light absorbing layer 300 may be gap-filled in the first perforation holes P1.

The $MoSe_2$ layer serving as the intermediate layer 250 has the surface resistance higher than that of the Mo layer serving as the back electrode layer 200. Thus, the intermediate layer 250 may have higher contact resistance, so it is necessary to remove the intermediate layer 250.

Figure 18:
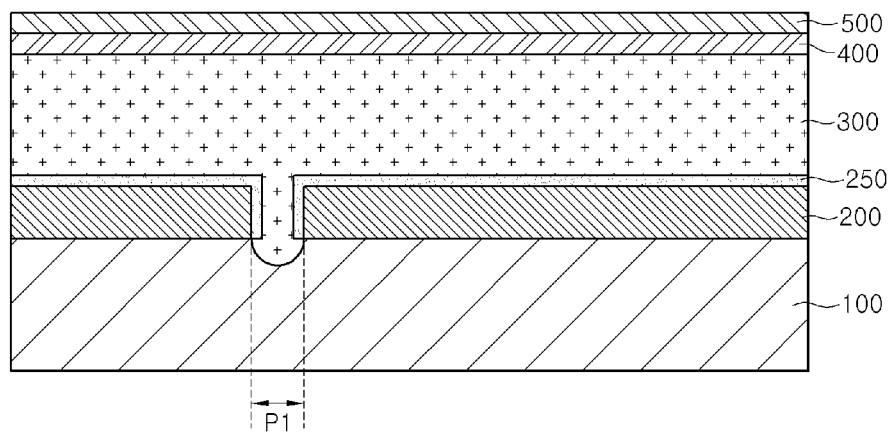

Referring to FIG. 18, the buffer layer 400 and the high-resistance buffer layer 500 are formed on the light absorbing layer 300.

The buffer layer 400 formed on the light absorbing layer 300 may include at least one layer. The buffer layer 400 can be formed by depositing CdS through the CBD (chemical bath deposition) process.

The buffer layer 400 is an N type semiconductor layer and the light absorbing layer 300 is a P type semiconductor layer. Thus, a PN junction is formed by the light absorbing layer 300 and the buffer layer 400.

The high-resistance buffer layer 500 is formed on the buffer layer 400 as a transparent electrode layer.

For instance, the high-resistance buffer layer 500 may include one of ITO, ZnO and i-ZnO.

The high-resistance buffer layer 500 can be formed as a ZnO layer by performing the sputtering process using ZnO as a target.

The buffer layer 400 and the high-resistance buffer layer 500 are disposed between the light absorbing layer 300 and the front electrode layer 600, which will be formed later.

That is, since there are great difference in the lattice constant and the energy bandgap between the light absorbing layer 300 and the front electrode layer 600, if the buffer layer 400 and the high-resistance buffer layer 500 having the intermediate bandgap are disposed between the light absorbing layer 300 and the front electrode layer 600, the superior junction property can be obtained.

According to the present embodiment, two buffer layers are formed on the light absorbing layer 300. However, the embodiment is not limited thereto. For instance, one buffer layer can be formed on the light absorbing layer 300.

Figure 19:
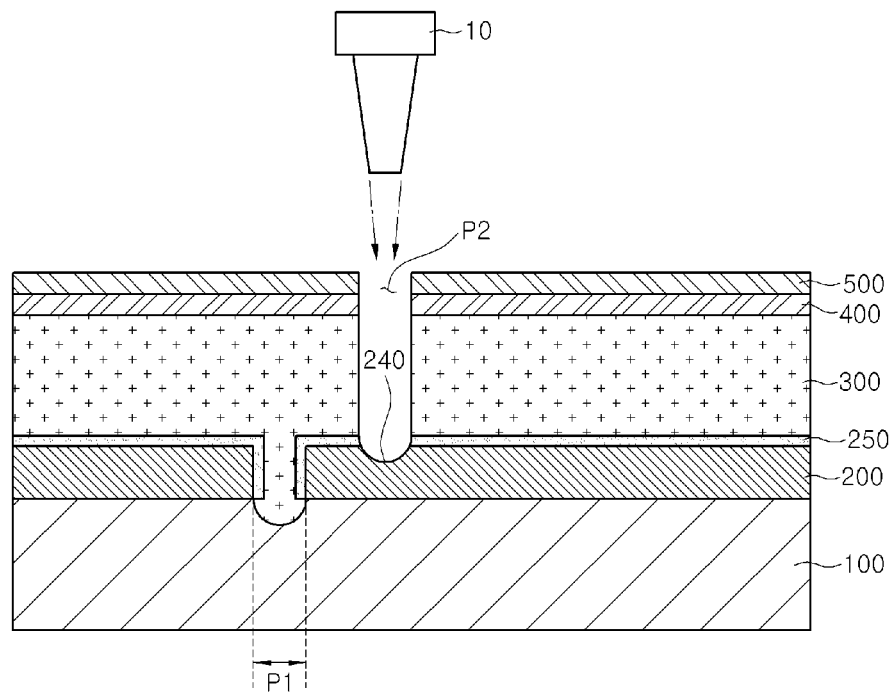

Referring to FIG. 19, the second perforation holes P2 are formed through the high-resistance buffer layer 500, the buffer layer 400, the light absorbing layer 300 and the intermediate layer 250.

The second perforation holes P2 can expose the back electrode layer 200.

When the second perforation holes P2 are formed, a part of the back electrode layer 200 is removed, so that the second recesses 240 are formed in the back electrode layer 200.

In detail, the second recesses 240 are recessed on the surface of the back electrode layer 200. The second recesses 240 extend from the second perforation holes P2.

The light absorbing layer 300 is separated from the buffer layer 400 by the second perforation holes P2 and the back electrode layer 200 is exposed by the second recesses 240 so that the step portion is formed in the back electrode layer 200.

The second recesses 240 are concaved with respect to the top surface of the back electrode layer 200 and curved surfaces are formed at bottom surfaces of the second recesses 240. The exposed area of the back electrode layer 200 may be increased due to the second recesses 240.

The intermediate layer 250 is partially removed when the second perforation holes P2 is formed so that the back electrode layer 200 is exposed. Especially, since the back electrode layer 200 is also partially removed, a part of the intermediate layer 250 corresponding to the second perforation holes P2 may be completely removed.

The second perforation holes P2 and the second recesses 240 can be formed through the isotropic etching process. That is, the second perforation holes P2 and the recesses 210 can be formed by performing the wet etching process using the water-jet.

The water-jet process to form the second perforation holes P2 and the second recesses 240 is identical to the water jet process to form the first perforation holes P1 and the first recesses 110, so detailed description thereof will be omitted in order to avoid redundancy.

Since the back electrode layer 200 is isotropically etched through the isotropic etching process using the water-jet, the bottom surfaces of the second recesses 240 may have the curved surfaces.

In general, if the laser process or the scribing process using the tip is performed, the sidewalls of the second perforation holes P2 may be non-uniform. That is, the roughness is formed at the inner surfaces of the second perforation holes P2 and the shunt path may be generated.

According to the present embodiment, the second perforation holes P2 are formed through the isotropic etching process using the water-jet, so the roughness of the inner surfaces of the second perforation holes P2 can be reduced.

Figure 20:
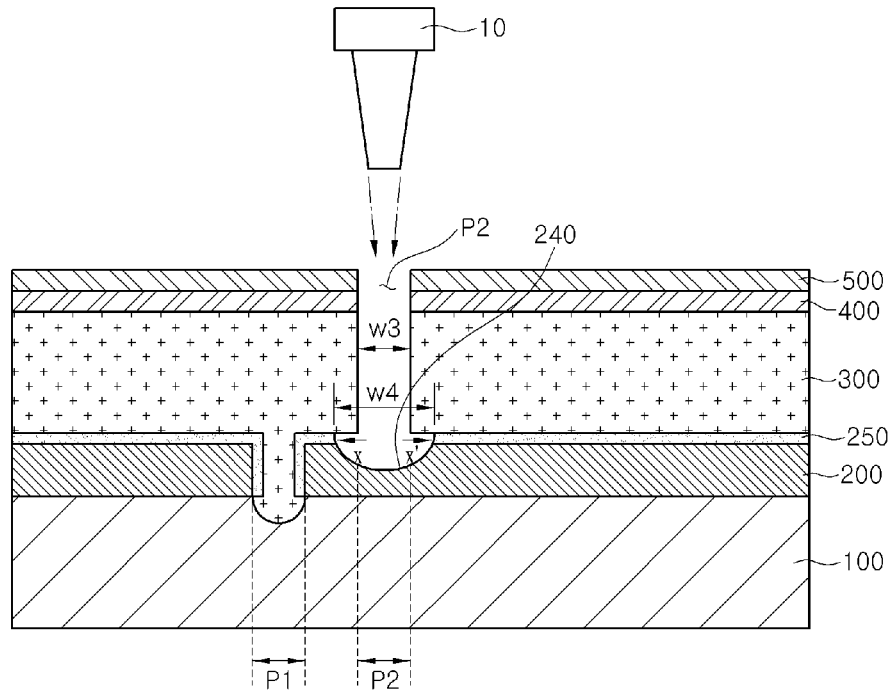

Further, referring to FIG. 20, if the water jet process time is lengthened, the etchant may penetrate into the back electrode layer 200 in the lateral direction (x-x'), so that the back electrode layer 200 is isotropically etched.

Therefore, the second recesses 240 have a width wider than a width of the second perforation holes P2. In detail, the second perforation holes P2 have a third width w3 and the second recesses 240 have a fourth width w4 wider than the third width w3.

For instance, the second perforation holes P2 may have a width in the range of about 40 μm to about 80 μm and the second recesses 240 may have a width in the range of about 60 μm to about 100 μm.

The second perforation holes P2 are aligned adjacent to the first perforation holes P1. For instance, the gap between the second perforation holes P2 and the first perforation holes P1 is in the range of about 40 μm to about 80 μm.

Then, the cleaning and drying processes are performed with respect to the substrate 100 including the second perforation holes P2.

The intermediate layer 250 is selectively removed by the second perforation holes P2 and the second recesses 240 so that the back electrode layer 200 is exposed. Thus, the exposed area of the back electrode layer 200 may be increased.

Figure 21:
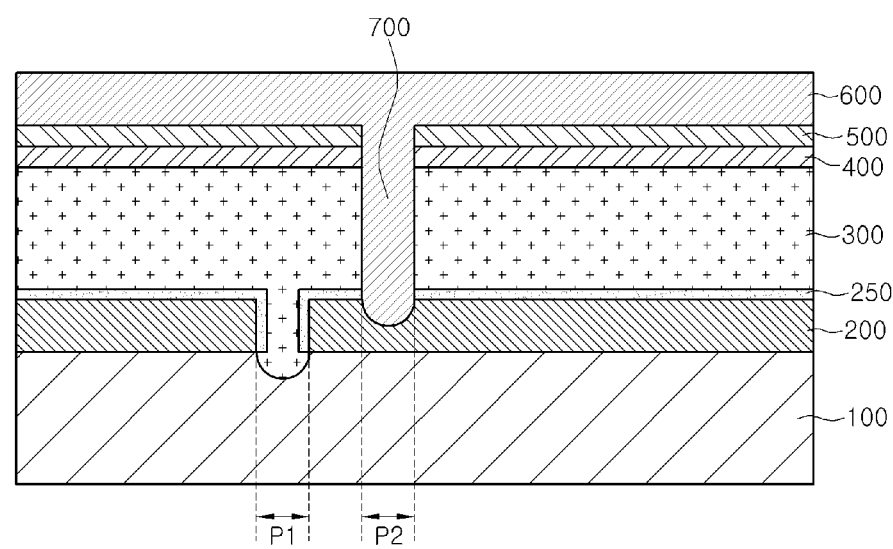

Referring to FIG. 21, a transparent conductive material is deposited on the high-resistance buffer layer 500 so that the front electrode layer 600 is formed.

When the front electrode layer 600 is formed, the transparent conductive material is filled in the second perforation holes P2 and the second recesses 240. Thus, the connection wires 700 are formed in the second perforation holes P2 and the second recesses 240.

The connection wires 700 are directly connected to the back electrode layer 200 through the second perforation holes P2. In addition, the contact area between the connection wires 700 and the back electrode layer 200 can be increased due to the second recesses 240.

As a result, the ohmic contact characteristic between the connection wires 700 and the back electrode layer 200 can be improved. Especially, the mobility and conductivity of the current flowing through the surface of the back electrode layer 200 serving as a back contact of the solar cell apparatus according to the embodiment can be improved.

The front electrode layer 600 can be formed by performing the sputtering process using Al or ZnO doped with $Al_2O_3$.

The front electrode layer 600 is a window layer that forms the PN junction together with the light absorbing layer 300. Since the front electrode layer 600 serves as a transparent electrode at the front of the solar cell, the front electrode layer 600 is formed by using ZnO having high light transmittance and superior electric conductivity.

Therefore, the electrode having a low resistance value can be formed by doping the ZnO with Al or $Al_2O_3$.

The ZnO layer serving as the front electrode layer 600 can be formed through the RF sputtering process using the ZnO target, the reactive sputtering process using the Zn target or the organic metal chemical deposition process.

In addition, the front electrode layer 600 may have a dual structure by depositing an ITO layer having the superior photoelectric property on the ZnO layer.

Figure 22:
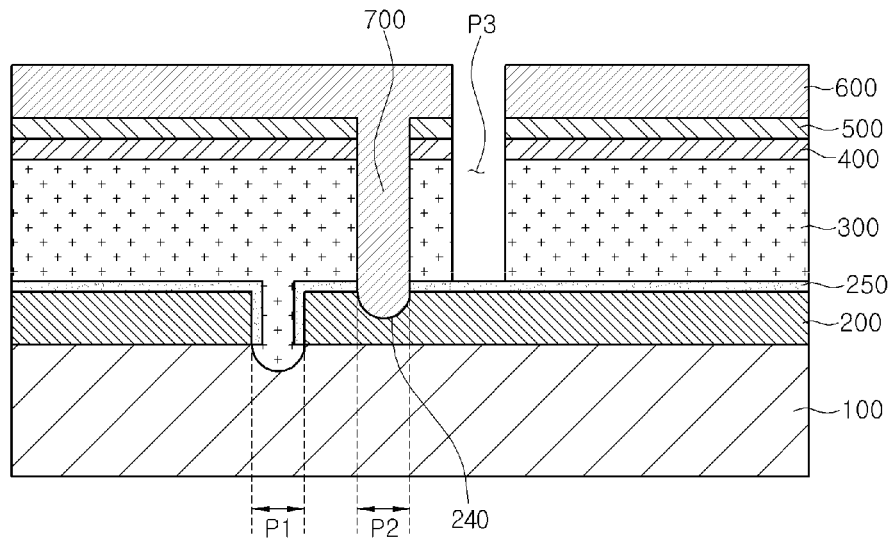

Referring to FIG. 22, the third perforation holes P3 are formed through the front electrode layer 600, the high-resistance buffer layer 500, the buffer layer 400 and the light absorbing layer 300.

The third perforation holes P3 can selectively expose the intermediate layer 250. The third perforation holes P3 are aligned adjacent to the second perforation holes P2.

For instance, the third perforation holes P3 may have a width in the range of about 40 μm to about 80 μm. In addition, a gap between the second and third perforation holes P2 and P3 is in the range of about 40 μm to about 80 μm.

The third perforation holes P3 can be formed through the laser irradiation scheme or the mechanical scheme by using a tip.

When the third perforation holes P3 are formed through the mechanical scheme, the surface of the back electrode layer 200 can be protected by the intermediate layer 250.

That is, since the intermediate layer 250 is formed on the surface of the back electrode layer 200, the intermediate layer 250 may serve as a lubricant when the etching process is performed by using the tip, so that the back electrode layer 200 can be prevented from being damaged.

The light absorbing layer 300, the buffer layer 400, the high-resistance buffer layer 500 and the front electrode layer 600 are divided into a plurality of cells C1, C2 . . . and Cn by the third perforation holes P3.

In addition, the cells C1, C2 . . . and Cn are connected with each other by the connection wires 700. In detail, the connection wires 700 may physically or electrically connect the front electrodes of adjacent cells to the back electrodes of the adjacent cells.

Figure 23:
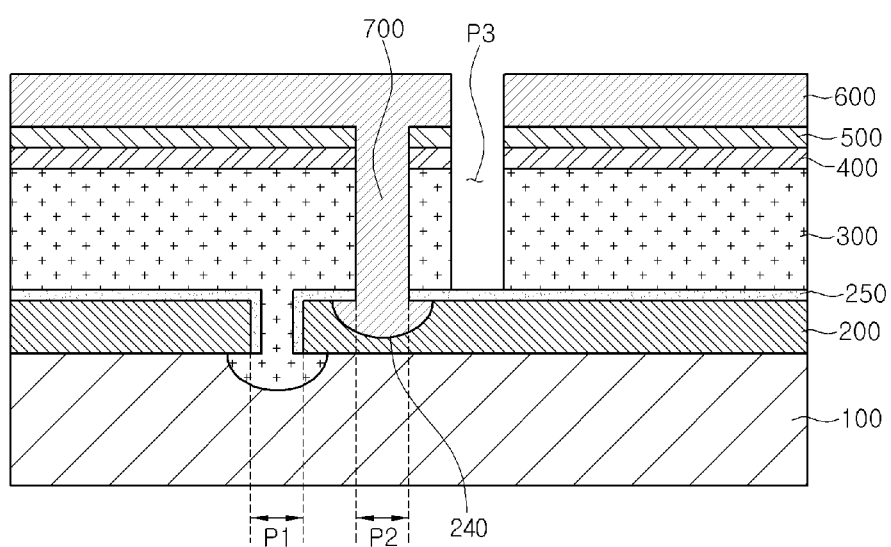

Referring to FIG. 23, the first recesses 110 extending downward from the first perforation holes P1 have the second width w2 and the second recesses 240 extending downward from the second perforation holes P2 have the fourth width w4.

According to the embodiment, the first and second perforation holes P1 and P2 can be formed through the isotropic etching process using the water-jet.

Thus, the back electrode layer 200 may not be delaminated from the substrate 100 in the first perforation holes P1 so that the device defect can be prevented.

In addition, when the second perforation holes P2 are formed, the MoSe$_2$ layer is selectively removed, so that the ohmic contact characteristic between the connection wires 700 and the back electrode layer 200 can be improved.

In addition, the MoSe$_2$ layer may prevent the back electrode layer 200 from being damaged.

Further, the residues generated when the first and second perforation holes P1 and P2 are formed can be removed and the leakage current can be prevented.

Therefore, the solar cell apparatus having the improved electric characteristics can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The solar cell apparatus according to the embodiment can be used in the field of the solar cell power generation.

The invention claimed is:

1. A solar cell apparatus comprising:
a substrate;
a back electrode layer on the substrate;
a light absorbing layer on the back electrode layer;
a front electrode layer on the light absorbing layer; and
a connection wire extending from the front electrode layer and connected to the back electrode layer through the light absorbing layer,
wherein the connection wire directly makes contact with an inner side of a cavity formed in the back electrode layer,
wherein a bottom surface of the cavity is positioned between a top surface of the back electrode layer and a bottom surface of the back electrode layer,
wherein the bottom surface of the cavity has a flat surface,
wherein the flat surface is parallel to a top surface of the substrate, and
wherein the cavity is filled with the connection wire such that all surfaces of the cavity are contacted by surfaces of the connection wire.

2. The solar cell apparatus of claim 1, wherein the light absorbing layer includes a perforation hole, the connection wire is aligned inside the perforation hole, and the cavity is located corresponding to the perforation hole.

3. The solar cell apparatus of claim 2, wherein an inner surface of the perforation hole is aligned on a same plane with an inner surface of the cavity.

4. The solar cell apparatus of claim 2, wherein the cavity has a width wider than a width of the perforation hole.

5. The solar cell apparatus of claim 1, further comprising an intermediate layer interposed between the back electrode layer and the light absorbing layer, wherein the connection wire extends by passing through the intermediate layer.

6. A solar cell apparatus comprising:
a substrate including a first cavity;
a back electrode layer on the substrate;
an intermediate layer on a top surface and a lateral surface of the back electrode layer;
a light absorbing layer on the intermediate layer and in the first cavity;
a front electrode layer on the light absorbing layer; a connection wire extending from the front electrode layer and directly connected to the back electrode layer through the light absorbing layer and the intermediate layer; and
a second cavity formed in the back electrode layer,
wherein a bottom surface of the second cavity is positioned between a top surface of the back electrode layer and a bottom surface of the back electrode layer, and
wherein the second cavity is filled with the connection wire such that all surfaces of the second cavity are contacted by surfaces of the connection wire.

7. The solar cell apparatus of claim 6, wherein the intermediate layer includes a material contained in the back electrode layer and a material contained in the light absorbing layer.

8. The solar cell apparatus of claim 6, wherein the intermediate layer includes MoSe$_2$.

9. The solar cell apparatus of claim 6, wherein the connection wire is disposed inside a perforation hole formed in the light absorbing layer and the intermediate layer, a cavity is formed in the back electrode layer corresponding to the perforation hole, and the connection wire directly makes contact with a bottom surface of the cavity.

10. The solar cell apparatus of claim 9, wherein the bottom surface of the cavity includes a curved surface.

11. The solar cell apparatus of claim 6, wherein a perforation hole is formed in the back electrode layer and the first cavity is formed under the perforation hole.

12. The solar cell apparatus of claim 11, wherein an inner surface of the first cavity includes a curved surface; and
wherein the light absorbing layer in the first cavity is in contact with a lower surface of the intermediate layer.

* * * * *